United States Patent [19]
Motowidlo et al.

[11] Patent Number: 5,550,103
[45] Date of Patent: Aug. 27, 1996

[54] SUPERCONDUCTOR TAPES AND COILS AND METHOD OF MANUFACTURE

[75] Inventors: Leszek Motowidlo, Bristol, Conn.; Pradeep Haldar, Guilderland, N.Y.

[73] Assignee: IGC/Advanced Superconductors, Inc., Waterbury, Conn.

[21] Appl. No.: 108,929

[22] Filed: Aug. 18, 1993

Related U.S. Application Data

[63] Continuation-in-part of Ser. No. 755,038, Sep. 4, 1991, abandoned.

[51] Int. Cl.$^6$ .............................. H01B 12/04; H01B 13/00
[52] U.S. Cl. .......................... 505/430; 505/432; 505/433; 505/705; 505/704
[58] Field of Search .............................. 505/1, 430, 432, 505/433, 705, 704

[56] References Cited

U.S. PATENT DOCUMENTS

| | | | |
|---|---|---|---|
| 4,906,609 | 3/1990 | Yamauchi | 505/1 |
| 5,004,722 | 4/1991 | Tallman | 505/1 |
| 5,057,488 | 10/1991 | Arendt | 505/1 |
| 5,221,663 | 6/1993 | Assmann | 505/1 |

FOREIGN PATENT DOCUMENTS 5-135635  6/1993  Japan ...................... 505/433

OTHER PUBLICATIONS

Haldar, Pradeep et al., "Enhancement in Critical Current Density of Bi–Pb–Sr–Ca–Cu–O Tapes by Thermomechanical Processing: Cold Rolling Versus Untaxial Pressing" *Applied Physics Letters*, vol. 60, No. 4, Jan. 27, 1992, pp. 495–497.

Shibuta, Nobuhiro et al. "Transport Critical Current Properties of Silver–Sheathed B. Based Superconducting Tapes and Coils at 4.2K" *Japanese Journal of Applied Physics*, vol. 30, N. 12B, Dec. 1991, pp. L2083–L2084.

Fukiger, R. "The Deformation of B (223) Tapes by Hot Rolling" *High Temp. Superconductivity Spring Symposium*, Apr. 12–16, 1993.

Halder et al, "Bulk Superconductivity at 112K in Tl(Ba, Ca)$_2$Ca$_3$Cu$_4$O$_{10.5+\gamma}$ with Four Consecutive Copper Layers", *Science*, vol. 241, Sep. 2, 1988, pp. 1198–1200.

*Primary Examiner*—Melissa Bonner
*Attorney, Agent, or Firm*—Helfgott & Karas, PC

[57] ABSTRACT

A method of producing a high temperature long length coil of superconductor wire or tape having improved critical current densities by utilizing an in-line pressing operation to heal the microcracks in the tape or wire which were introduced in rolling and coiling operations. The material can be Bismuth-2223, Bismuth 2212, Thallium-1234 or any other high temperature superconducting material. In the case of the Bismuth-2223, an improved "powder-in-tube" processing operation is provided to utilize excess bismuth, calcium, and copper in the initial composition material, and forming a partially developed Bi-2223 phase in the precursor powder introduced into the silver tubes. The final product has a 90–100% Bi-2223 phase with fine dispersions of secondary phases, to provide improved flux pinning thereby improving the critical current density of the material.

22 Claims, 5 Drawing Sheets

SUPERCONDUCTOR TAPES AND COILS AND METHOD OF MANUFACTURE

This application is a continuation-in-part of Ser. No. 07/755038, filed Sep. 4, 1991, now abandoned.

BACKGROUND OF THE INVENTION

1. Field of the Invention

The present invention relates generally to superconductor materials formed from powdered metal oxides, and particularly relates to providing improvements on long length high temperature superconductor wires and tapes such as Bismuth-2223, Bismuth-2212 and Thallium-1234, such improvements including reduced microcracks, improved critical current densities, and higher flux pinning.

2. Description of Prior Art

Superconductor wires and tapes have, for many years, been fabricated according to a conventional technique known as the "powder-in-tube" method. One example of such method is described in U.S. Pat. No. 4,906,609, although more recently, the use of silver tubes has been preferred for forming such wires and tapes. Typically, the method involves utilizing initial starting materials and providing for a series of grinding and heat treatment operations to produce a powdered mixture which is then packed into the silver tube. Thereafter, a series of cold working operations including drawing and rolling are performed to thereby provide a desired thickness of the wire or tape. An intermediate heat treatment is introduced followed by rolling to final thickness and thereafter, annealing. The wire or tape is then formed into a magnet coil and the final heat treatment operation is performed on the magnet coil.

Figure 1:
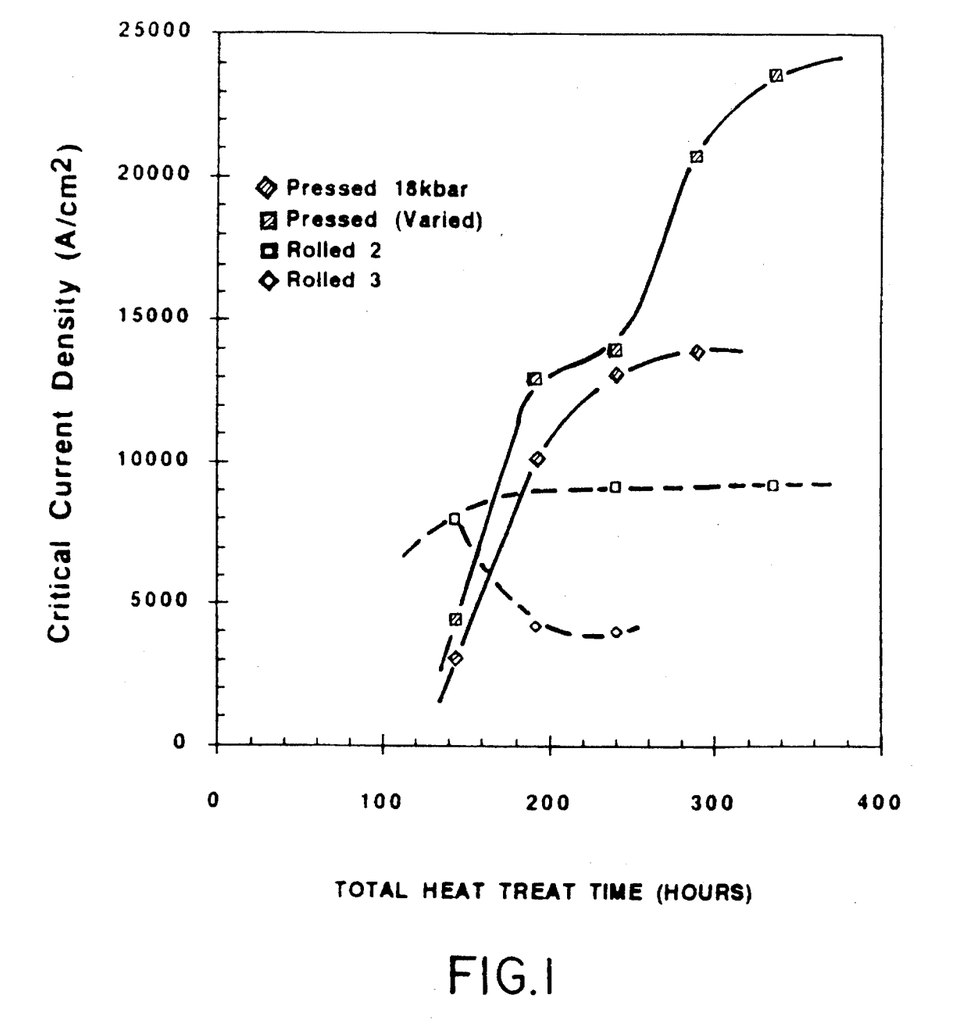
FIG. 1 is a graph showing the critical current density verses the heat treatment for both rolling and pressing when used for shaping to final thickness.

A number of problems have been found with the final magnet coil thus produced. One problem relates to the introduction of microcracks. An illustration of a typical microcrack can be seen in FIG. 2. Generally, such cracks are introduced during the rolling operations while producing the final thickness. For example, we have found that the critical current density (Jc) when pressed to final thickness rather than rolled and heat treated repeatedly will show improvement as a function of time. However, under similar conditions of temperature and time the Jc for repeated rolling/heat treatments to produce the final thickness does not show improvements. In contrast, the Jc decreases as the rolling steps increase. The graph of FIG. 1 illustrates the differences achieved when pressing as opposed to rolling to achieve the final thickness. Plots 1 and 2 illustrates the Jc's obtained versus total heat treatment time for wires pressed at varied pressures and at 18 kbar pressure, respectively. FIG. 1 illustrate the Jc's obtained versus total heat treatment time for wires rolled twice and three times, respectively. During the rolling operations we find increased development of microcracks, which is a consequence of the non-uniform application of stresses from the rolls. The enhancement of the critical current density by using uniaxial pressing instead of cold rolling, to produce the final thickness of the wire or tape, prior to annealing is disclosed in Applied Physics Letters, Volume 60, Number 4, Jan. 27, 1992 pages 495–497.

The method of starting with a composition of material having an excess of bismuth and calcium and utilizing the "powder-in-tube" method of placing ground powder into silver tubes, drawing the powder into round wires and then making it into tapes by pressing or rolling is disclosed in The Japanese Journal of Applied Physics, Volume 30, Number 12B, December 1991, pages L2083–L2084. Although this reference states that Jc's of up to $5.4 \times 10^4$ A/cm$^2$ at 77.3K in a zero magnetic field and $8.9 \times 10^4$ A/cm$^2$ at 4.2K in a magnetic field of 23T were obtained, these Jc's can only be obtained on very small lengths of wire. This method is, furthermore, not commercially practiced. Performing such a method on wires having a length which is not very small causes severe discontinuities. Severe discontinuities refers to variations in thickness induced by the type of pressing disclosed along with the possible introduction of microcracks. The pressing disclosed is also not an in-line pressing to improve flux pinning sites, this pressing is to obtain the final thickness and shape of the wire. This method, therefore, would create severe discontinuities and is, therefore, not applicable for producing a wire having a length which is more than negligible.

It has also been suggested to deform Bi-2223 tapes by hot rolling. Such was introduced by R. Flukiger, A. Perin and E. Walker from the Universite de Geneve in Switzerland at the Materials issues in High Temperature Superconductivity Spring Symposium T on Apr. 12–16, 1993. A deformation technique was developed to enhance the degree of texturing as well as the density by hot rolling. A prototype rolling machine was constructed with rolls of 80 mm diameter that can be heated up to 800° C. Various problems were encountered, each requiring separate solutions. The most important are: a) the flow of the Ag sheath at elevated temperatures which leads to enhanced sausaging, b) sticking of the Ag sheath to the heated rolls, and c) the precise determination of the tape temperature between the two rolls.

Additionally, problems with the final coil can result from the appropriate starting materials. One prior art method is to initially utilize ground powders of nonsuperconducting phase as Bismuth-2212 as part of the initial matrix powder inserted into the silver tube. Such has been described by way of example in U.S. Pat. No. 5,057,486.

While there is continued progress at providing increased critical current densities for such high Tc superconductor materials, further improvements are still needed. Furthermore, when providing long length coils of such wire and tape, the microcracks introduced into the high Tc materials continue to detract from the improved current densities needed in such materials.

In addition to the Bismuth based high Tc materials, similar problems have been found in the Thallium based high Tc materials, such as Thallium-1234.

Accordingly, a method of healing such microcracks is needed, and at the same time of producing improved methods for providing high Tc Bismuth based and Thallium based superconductors having improved critical current densities as compared to present known superconductors.

SUMMARY OF THE INVENTION

The present invention relates to a method of healing microcracks on long length coils of high temperature superconductor wires and tapes such as Bismuth-2223, Bismuth 2212 and Thallium-1234. The method, as shown in FIG. 3, comprises the steps of first producing the superconductor wire or tape to its desired final thickness through utilizing a reiteration of operations involving one of rolling or pressing followed by heat treatments. Thereafter, following the final rolling or pressing/heat treatments, the tape conductor is in-line pressed in which pressing of the tape conductor is performed carefully in an overlapped fashion. The tape or wire is then coiled to produce the final desired magnet coil, and final heat treatment of the coil is carried out. The in-line pressing of the tape or wire conductor may also be performed at a higher temperature, the same temperature at which the heat treatment is performed, thus combining the steps of in-line pressing and heat treating.

The in-line pressing serves to improve the properties of the superconductor by healing the microcracks and lining up the flux pinning centers and not for producing further changes in the overall tape thickness. With regards to improving the flux pinning sites, when the temperature is raised to a value greater than or equal to 800° C. either during or after pressing, then the ceramic will become ductile and respond more plastically. This allows dislocations to be introduced into the material by pressing without brittle cracking. Dislocations are line defects, essentially a dislocated plane of atoms in the crystal structure. These dislocations are used as new pinning sites for the flux lattice, thus improving the flux pinning.

After the in-line pressing there can be provided an additional step of annealing. The process of in-line pressing, followed by annealing, can be repeated thereafter, and then producing the final magnet coil. The annealing may also be performed concurrently with the in-line pressing, more simply the in-line pressing may be performed at high temperatures.

In one embodiment of the invention, the superconductor material is Bismuth-2223 which is formed by selection and initial composition of materials providing an excess of bismuth, calcium, and copper over the ideal stoichiometric values of the Bi-2223. The initial composition is prepared as a precursor powder by utilizing a series of operations involving grinding and sintering. The precursor powder is then inserted into a silver tube using the "powder-in-tube" method for producing wires and tapes. Thereafter, the packed billets are extruded and rolled or pressed using various mechanical processing steps. These are interspersed with intermediate heat treatment operations. An additional shaping operation may be included during the heat treatment. The final superconductor material contains 90 to 100% pure 2223 phase with the rest being 2212 phase and other non-superconductor phases in the final product.

In another embodiment of the invention, the superconductor material can be Thallium-1234. The Thalium-1234 is formed by selection and initial composition of materials providing an excess of Bi, Pb, and Sr over ideal stoichiometric values of the Tl-1234. The wire or tape to be used in the final pressing and heat treatment steps is also formed by the "powder-in-tube" method.

The final product provides increased current density with most of the microcracks having been healed, in order to provide a superior superconductor tape or wire.

DETAILED DESCRIPTION OF THE PREFERRED EMBODIMENTS

In forming coils of long length composed of high temperature superconductors such as Bi-2223, Bi-2212 and Tl-1234, it has been found that through the various processing steps such as rolling or pressing and final coiling microcracks are introduced within the superconductor. These microcracks provide imperfections whereby the transport current of the ultimate superconductor wire or tape is reduced from the ideal.

Typically, in producing a long length magnet coil of superconductor wire or tape of such high temperature materials, the materials are processed through various known methods, typically, using the "powder-in-tube" method to form such wires. During such processing, an initial powder is prepared and the powder is packed into a silver tube. The packed tube is then drawn, rolled or pressed and annealed to produce the wire or coil's desired thickness. The steps of rolling or pressing and annealing are typically repeated until the desired thickness and shape is produced. Thereafter, the tape or wire is wound into a magnetic coil and provided for the final use. The final coil is then heat treated in a final heat treatment step.

Figure 2:
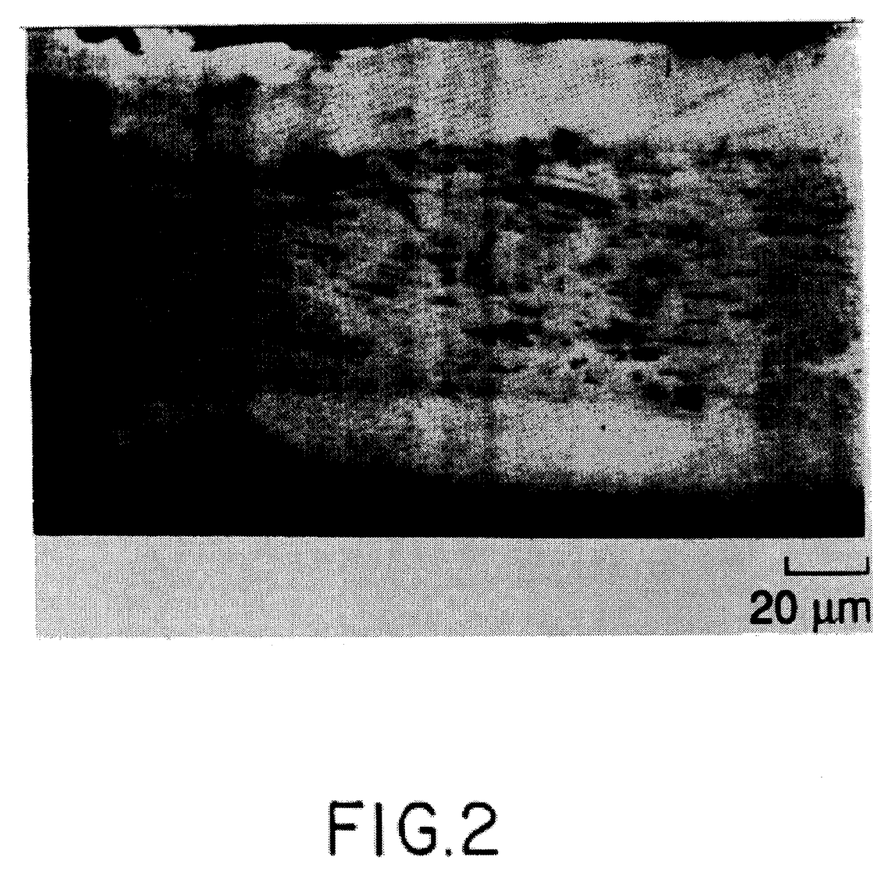
FIG. 2 illustrates a microcrack in a Bi-2223 composite tape.
Figure 3A:
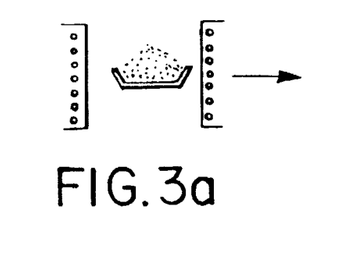
FIG. 3 is a flow diagram showing the various steps in a typical process of making a high temperature superconductor in accordance with the present invention.
Figure 3B:
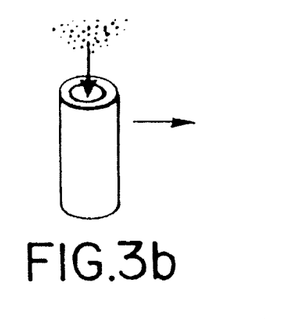
Figure 3C:
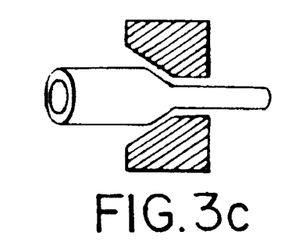
Figure 3D:
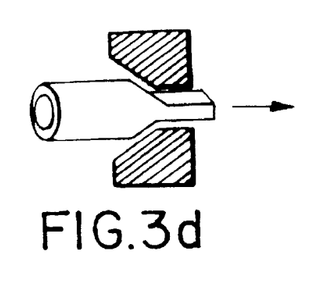
Figure 3E:
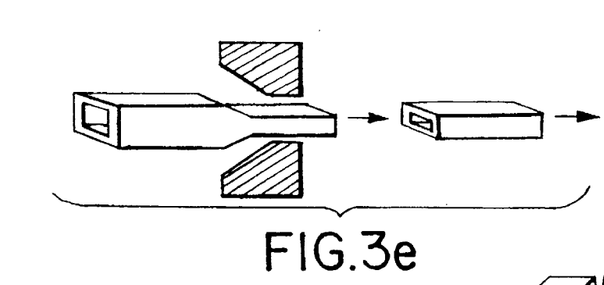
Figure 3F:
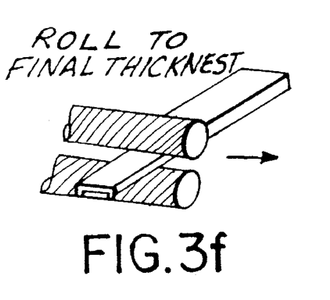
Figure 3G:
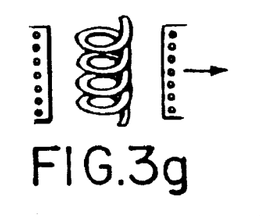
Figure 3H:
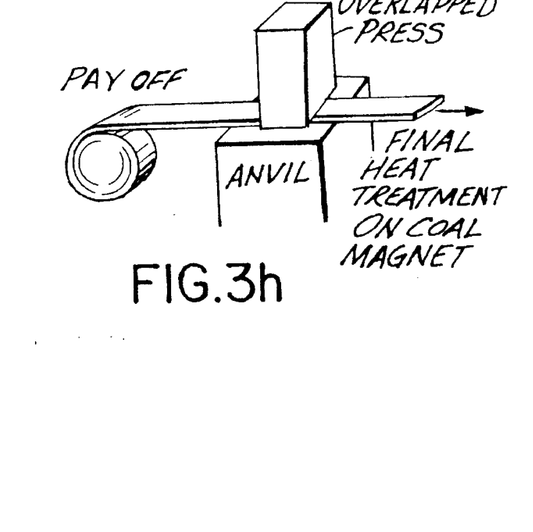

It has been found that, despite the numerous steps taken to provide suitable starting materials and appropriate processing steps in producing high current densities in long length coils, the rolling and coiling processes introduce microcracks into the final product, an illustration of such a microcrack can be seen in FIG. 2. This tends to reduce the overall current density capabilities of the superconductor tape or wire.

In the present invention, it has been found that by pressing the tape or wire after the tape or wire has achieved its final thickness, with such pressing being utilized not for reduction of thickness but for modifying the properties, that the microcracks previously introduced may be healed. Accordingly, in-line pressing preferably involves applying a pressure to the wire or tape less than that applied during previous processing steps. Providing an in-line pressing step after the final thickness of the wire or tape has been achieved, serves to reduce the microcracks. The in-line pressing further creates and aligns continuous non-random pinning centers. Such in-line pressing can be done by spooling out the wire or tape and providing overlapped pressing in sections of the wire or tape as it passes along the in-line press operation. The pressing is performed in an overlapped fashion so that the entire wire or tape is pressed using an equal amount of pressure throughout.

After the in-line pressing, the wire or tape can then be coiled for magnet wire use or it can be heat treated and the in-line pressing and heat treatments repeated a number of times until the final coil is formed. The heat treatments can also be performed concurrently with the in-line pressing by pressing the material at a higher temperature, typically 800°–840° C. After the final magnet coil is produced, there is still provided the heat treatment of the magnet coil.

In utilizing the in-line pressing step, a Bi-2223 superconductor material has been used. The processing of Bi-2223 has also been improved whereby a number of processing steps have been introduced to provide higher current densities to the final Bi-2223 material and additional and aligned flux pinning sites during the formation.

Referring now to FIG. 3, there will be shown an example of the formation of the Bi-2223 tape or wire utilizing the improved processing steps and using the in-line pressing operation for reducing microcracks.

The initial materials used a thoroughly mixed component of oxides and/or carbonates of Bi, Pb, Sr, Ca, and Cu in various appropriate amounts. This premixture can also be prepared by co-precipitation from the oxalates, nitrates, etc.

In the present invention, the initial compositions utilize a slight excess in the Bi, Ca, and Cu components over the stoichiometry of $Bi_{1.6} Pb_{0.4} Sr_{2.0} Ca_{2.0} Cu_{3.0} O_x$.

The range of excess Bi, Ca, and Cu can be as follows:

Bi=0.2 to 1.0

Ca=0.1 to 2.0

Cu=0.1 to 2.0

The compositions that were found to give the best results were as follows:

Sample A $Bi_{1.8} Pb_{0.4} Sr_{2.0} Ca_{2.2} Cu_{3.0} O_x$

Sample B $Bi_{1.8} Pb_{0.4} Sr_{2.0} Ca_{2.5} Cu_{3.3} O_x$

In a typical example, the starting materials providing the results of Sample B of the above formulas were as follows:

$Bi_2O_3$–3.9942 grams

PbO–0.8503 grams $SrCO_3$–2.8122 grams $CaCO_3$–2.3827 grams

CuO–2.5000 grams

Figure 4:
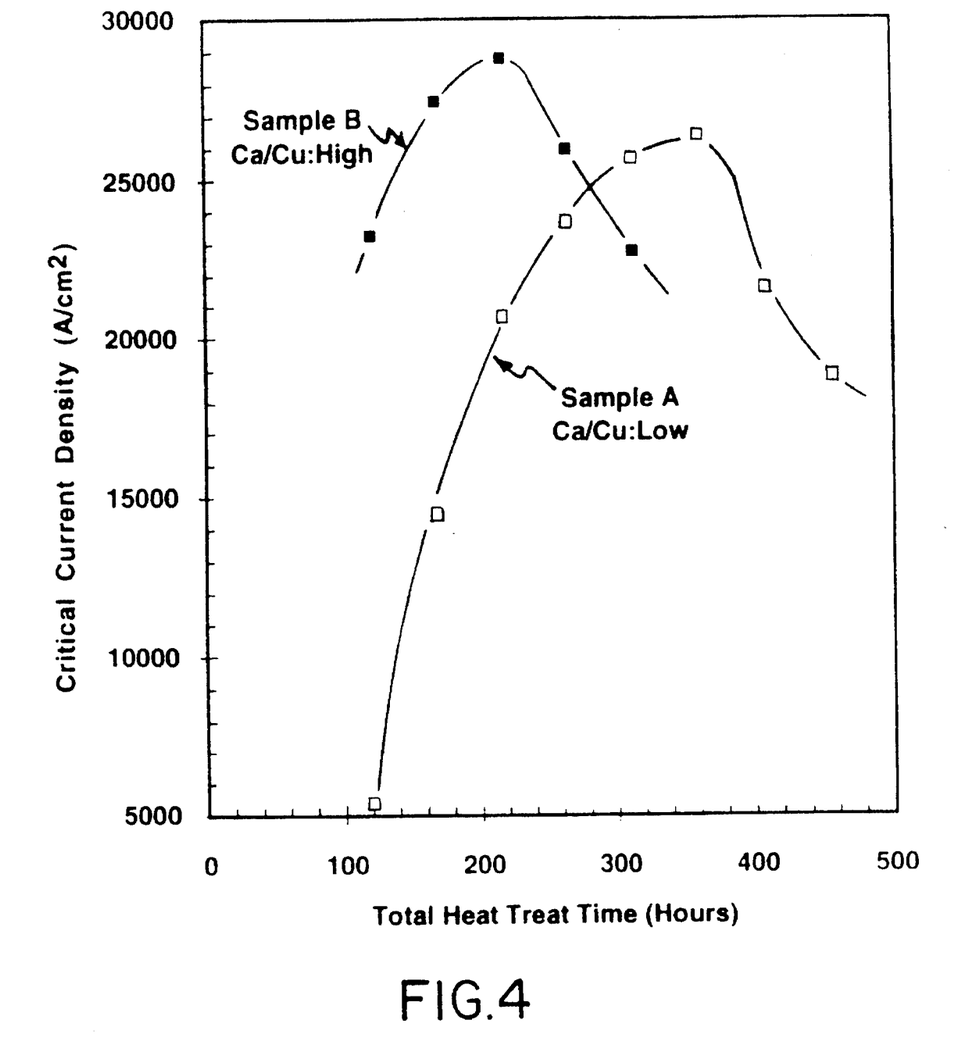
FIG. 4 is a graph showing the amount of heat treatment time required for different samples having excess calcium and copper.
Figure 5:
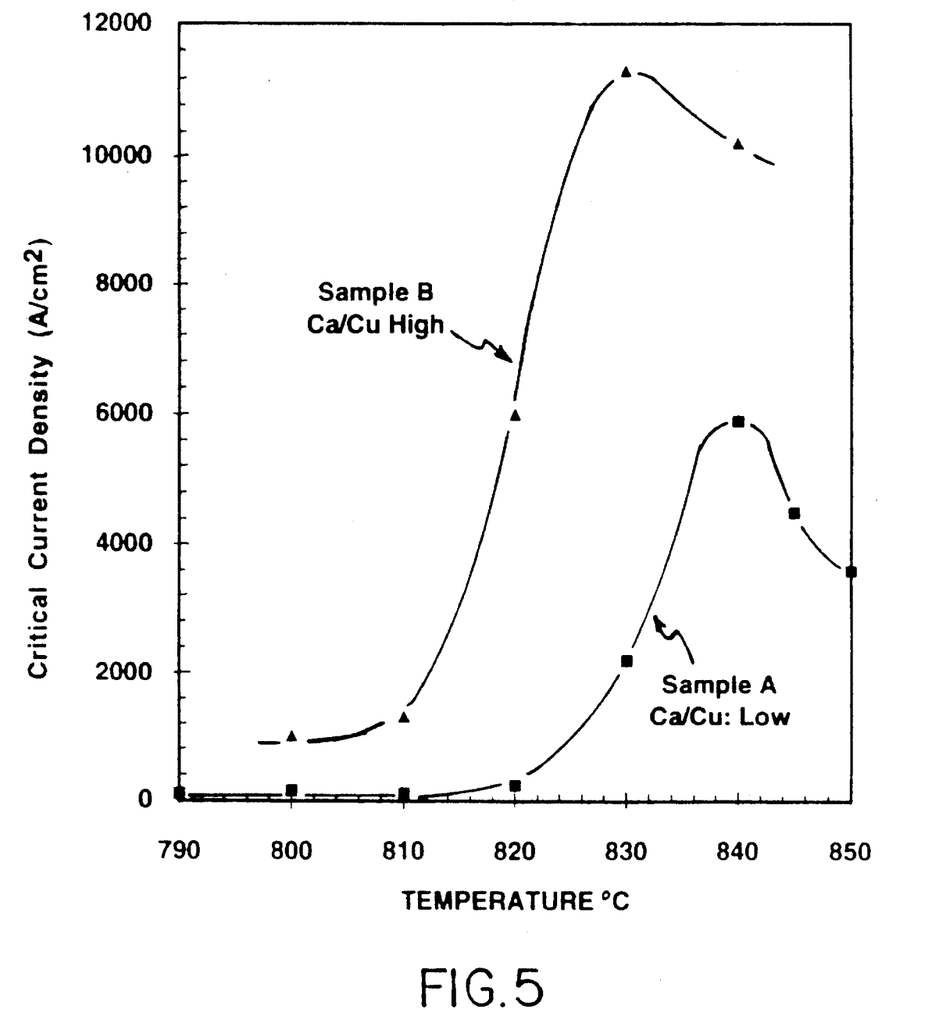
FIG. 5 is a graph showing the temperatures required for heat treatment of the samples having excess calcium and copper to produce the desired critical current densities.

The pre-mixed oxides and carbonates are heat treated in air or reduced oxygen (less than 10% atmosphere) at 800°–840° C. for 24–48 hours, as shown in Step A in FIG. 3. The total amount of heat treatment time and the temperature required for such heat treatment depends upon the excess of calcium and copper in the composition, as shown in FIGS. 4 and 5. FIG. 4 illustrates results obtained, comparing high and low calcium and copper amounts in the composition after pressing as a function of total heat treatment time. Although not indicated on the graphs, values of over 40,000 $A/cm^2$ have been obtained. FIG. 5 illustrates results obtained comparing high and low calcium and copper amounts in the composition, after rolling as a function of final heat treatment temperature. The samples used in FIGS. 4 and 5 are samples A and B shown previously in this disclosure. As shown in FIGS. 4 and 5, for a higher excess of calcium and copper there is less time required for the heat treatment and likewise, lower temperatures are required to produce the higher critical current densities desired. For a lower excess of calcium and copper, there is an increased amount of heat treatment time required, and the heat treatment temperatures are higher. Furthermore, the resulting current densities are lower.

The sintered precursor is ground in a ball mill, jet mill, or mixer mill to particle sizes less than 20 um. Typically, desired values are between 1–5 um. It is critical to use grinding times less than one hour. Typically, the grinding times are between five and fifteen minutes. It has been found that using such short grinding times prevents severe damage to the structure of the formed phases.

The powders are then heat-treated a number of times. The heat treatments and grinding routines may be repeated from 1 to 4 times to achieve the desired partially reacted phases. This is referred to as the "precursor powder". At this stage the Bi-2223 phase is not completely developed. The powder consists of less than 30% of 2223 phase or ideally a range of 10–30% developed Bi-2223 phase. The other phases are Bi-2212 and non superconductor phases such as alkaline earth cuprates, copper oxide, etc.

The precursor powders are then packed in silver or silver alloy tubes having densities higher than 3.0 grams/$cm^3$. The packing is achieved by mechanical ramming or by ultrasonic vibration as shown in Step B of FIG. 3.

The packed billets are then swagged, drawn, extruded, or rolled using conventional metal processing equipment as shown in Step C of FIG. 3. Typically, the reductions per pass are limited to 30% during the mechanical processing steps. Such machine steps are typically conducted in the round.

It has been found that improved texture development can be achieved by adding additional shaping operations during the heat treatment operations. Specifically, as shown in Step D, there is initially provided square shaping wherein the material goes from a round to a square shape. Thereafter, as shown in Step E, the square shape is modified to a rectangular shape. These shaping operations have improved the texture of the final product.

A series of cold working operations including rolling are then carried out, as shown in Step F. These are interspersed with intermediate heat treatments as shown in Step G. These are then repeated in order to develop the optimum microstructure with enhanced texture, of Bi-2223 phase development with finely distributed secondary phases.

One, two, three, or four intermediate heat treatments are performed in air or reduced oxygen (less than ten per cent atmosphere) at temperatures between 800°–840° C. for a duration of 24–100 hours. The curves in FIGS. 4 and 5 are again applicable to determine length of time and the temperature depending on the excess of calcium and copper involved.

The total reduction during the mechanical deformation processing and prior to the last heat treatment should be less than fifty per cent.

As shown in FIG. 3 Step H, after the final annealing operation, wherein the wire or tape has been rolled to its final thickness, the wire is then passed through an in-line pressing operation. The tape or wire can be provided as a coil or in a spool as indicated on the payoff of Step H in FIG. 3, and passed through in-line pressing wherein the pressing is achieved in sections. Typically, the sections will be overlapping in order to provide pressing of all the sections of the tape or wire.

Following the in-line pressing, the final coil can be wound and provided as the magnet coil wherein the final heat treatment will occur.

If necessary, after the in-line pressing there can be a heat treatment process followed by an additional in-line pressing. This can be repeated until the desired perfection in the wire is achieved.

The in-line pressing may also be performed at a higher temperature, a temperature equal to that used in heat treating the coil, thus combining the steps of in-line pressing and heat treatments.

It has been found that the in-line pressing is done not for reduction in thickness, but simply to improve the properties and heal the microcracks previously introduced during the rolling and coiling operations. These results are obtained by in-line pressing and heat treatments in separate steps and also when performed concurrently.

The final wire or tape that has been produced has been found to have 90–100% pure Bi-2223, the rest being Bi-2212 and other non superconductor phases. The presence of such additional phases serve to improve the flux pinning operation. Furthermore, the healing of the microcracks likewise improves the structure of the material. In this way, the final product of the coil has been found to have improved critical current density.

The Thallium based HTS superconductor, which has the highest transition temperature (122K) of single-layer Tl compounds, is prepared in the form of a composite with a metallic sheath such as a silver or silver alloy. As with Bismuth, the conventional "powder-in-tube" approach with the appropriate heat treatment and cold working processing is used. Ideal stoichiometry of the Tl-based superconductor is:

$$Tl_{1.0} (Ba)_{2.0} Ca_{3.0} Cu4.0 O_x$$

Variations from this stoichiometry may provide the ideal phase development. Doping with other elements or substitutions could also enhance the kinetics. Elements such as Pb and Bi could be used.

Oxides and/or carbonates of Tl, Ba, Ca, Cu are used in the appropriate amounts. The Tl-1234 phase is formed by mixing, heat treating and grinding the powder 1 to 4 times. The heat treatments could be carried out in a flowing oxygen atmosphere for 1 to 24 hours each. The temperatures should range from 850° to 950° C. To obtain phase pure Tl-1234 the following compositions can be used:

Tl 1 0.5 to 1.5 (atomic ratio)

Ba 0.5 to 2.0

Ca 2.0 to 5.0

Cu 2.0 to 5.0

An example of composition that yields the 1234 phase is:

$$Tl_{1.33} Ba_{1.33} Ca_4 Cu_4 O_x$$

Some of the above elements can be substituted by Bi and/or Pb and/or Sr to stabilize the 1234 phase. The range of substitution that can be used is:

Bi 0.1 to 1.0

Pb 0.1 to 1.0

Sr 0.1 to 2.0

The Tl-1234 phase pure powder is then packed into a silver, silver alloy or other non-reactive metallic tube and processed using conventional "powder-in-tube" technology, as illustrated in Step B of FIG. 3. A repeated cold work and heat treatment could be used to obtain tape or wire composites with good current carrying properties. Heat treatment could be performed between 850° and 950° C. for times of from 1 to 50 hours to achieve the appropriate microstructure. The Tl-1234 is then provided as a coil or in a spool and passed through in-line pressing and heat treating as described above with respect to the Bi-2223 and shown in Step H of FIG. 3. The in-line pressing and heat treating are performed separately or concurrently, pressing at increased temperatures, in both instances the temperature range used remains constant, 800°–840° C. Jc's obtained for Tl-1234 have been similar to Bi-2223. The Jc's have been in excess of 40,000 A/cm².

An alternate method of fabricating the Tl-1234 conductor is to perform the reaction heat treatments during the final stages of processing. Mixtures of Ba, Ca and Cu are initially prepared in the appropriate amounts and heat treated to form the cuprates of Ba and/or Ca. Prior to packing into the tube the oxide of Thallium is intimately mixed in with the precursors. The substitution elements such as Bi, Pb and Sr may be added to the initial precursor or prior to packing into the tubes. The composite billets are then mechanically deformed and given a heat treatment in flowing oxygen between 850° and 950° C. for 1 to 50 hours to achieve the appropriate microstructuring with good current carrying properties. A repeated cold-work and annealing treatment may provide additional densification and texture in the superconducting core. The Tl-1234 is then subject to in-line pressing and heat treating as previously described with respect to Bi-2223. The in-line pressing and heat treating are performed separately or concurrently. The compositions used in this alternate method would be similar to that previously described.

In both the approaches described the powders could also be prepared by co-precipitation from oxalates and/or nitrates. Furthermore, this method is applicable for all high temperature superconducting materials.

There has been disclosed heretofore the best embodiment of the invention presently contemplated. However, it is to be understood that various changes and modifications may be made hereto without departing from the spirit or scope of the invention.

What is being claimed is:

1. An improved method of producing coils of high temperature superconductor wire and tape by passing the superconductor through a series of operations involving at least one of a rolling operation and a pressing operation to generate a final thickness of the wire and tape, coiling the wire or tape and annealing, and thereafter reducing microcracks formed during production of the wire or tape, said method comprising uncoiling the wire or tape and in-line pressing the superconductor wire or tape in sections at a pressure less than that applied to the wire or tape in the series of operations, recoiling the wire or tape, and providing final heat treatment of the coil at temperatures above 800° C. thereby creating and aligning non-random pinning centers in the superconductor coil.

2. The method of claim 1, wherein said step of in-line pressing proceeds in overlapped pressing of sections of the superconductor wire or tape.

3. The method of claim 1, wherein said step of in-line pressing does not materially reduce the thickness of the coil or tape.

4. The method of claim 1, further comprising annealing after said in-line pressing and thereafter repeating the step of in-line pressing prior to re-coiling of the wire.

5. The method of claim 1, wherein the in-line pressing is performed concurrently with heat treatment.

6. The method of claim 5, wherein the concurrent heat treatment temperature is in the range of 800°–840° C.

7. The method of claim 1, wherein said superconductor is Bi-2223.

8. The method of claim 1, wherein said superconductor is Tl-1234.

9. The method of claim 1, wherein the superconductor has an initial composition of materials to provide an excess of at least one of Bi, Ca and Cu over the stoichiometry of $Bi_{1.6} Pb_{0.4} Sr_{2.0} Ca_{2.0} Ci_{3.0} O_x$ wherein x is the amount of oxygen present.

10. The method of claim 9, wherein the excess range is as follows:

Bi=0.2 to 1.0

Ca=0.1 to 2.0

Cu=0.1 to 2.0.

11. The method of claim 9, wherein the initial composition provides for $Bi_{1.8} Pb_{0.4} Sr_{2.0} Ca_{2.5} Cu_{3.3} O_x$ wherein x is the amount of oxygen present.

12. The method of claim 9, wherein the initial composition provides for $Bi_{1.8} Pb_{0.4} Sr_2 Ca_{2.2} Cu_{3.0} O_x$ wherein x is the amount of oxygen present.

13. The method of claim 9, further comprising producing from the initial composition a precursor powder which is between 10 and 30% developed Bi-2223 phase, placing the precursor powder into silver tubes, drawing and shaping the packed tubes through a series of mechanical processing steps with intermediate heat treatments to develop the final thickness of Bi-2223 wire or tape.

14. The method of claim 13, wherein producing the precursor powder comprises the steps of heat treating the composition at temperatures of between 800° and 840° C. for am amount of time between 24 and 48 hours, grinding the sintered precursor to particle sizes less than 20 um and repeating the heat treatment and grinding routines 1 to 4 times to achieve the precursor powder.

15. The method of claim 14, wherein the grinding of the sintered precursor is performed for a time of less than one hour.

16. The method of claim 15, wherein the grinding of the sintered precursor is performed for a time of between 5 and 15 minutes.

17. The method of claim 13, wherein placing the precursor powder into silver tubes, drawing and shaping the packed tubes provide reductions in the round of less than 30% per pass.

18. The method of claim 13, and further comprising an additional shaping operation during the heat treatment to enable texture development, said additional shaping comprising shaping the superconductor cross section from round to square and thereafter from square to rectangular.

19. The method of claim 13, wherein there are between 1 and 4 intermediate heat treatments performed, each heat treatment being at temperatures between 800° and 840° C. for durations of between 24 and 48 hours.

20. The method of claim 13, wherein the total reduction during the steps of placing the precursor powder into silver tubes, drawing and shaping the packed tubes prior to the last heat treatment is less than 50%.

21. The method of claim 1, wherein the superconductor has an initial composition in which Bi, Pb, and Sr are substituted for some elements in the stoichiometry of $Tl_{1.0} Ba_{2.0} Ca_{3.0} CU_{4.0} O_x$ wherein x is the amount of oxygen present.

22. The method of claim 21, wherein the range of substitutions is as follows:

Bi=0.1 to 1.0
Pb=0.1 to 1.0
Sr=0.1 to 2.0.

* * * * *